United States Patent
Haeberli (10) Patent No.: US 6,819,966 B1
(45) Date of Patent: Nov. 16, 2004

(54) FABRICATION OF FREE FORM STRUCTURES FROM PLANAR MATERIALS

(76) Inventor: Paul E. Haeberli, 5802 Anchorage Ave., Madison, WI (US) 53705

(*) Notice: Subject to any disclaimer, the term of this patent is extended or adjusted under 35 U.S.C. 154(b) by 0 days.

(21) Appl. No.: 10/730,391

(22) Filed: Dec. 6, 2003

(51) Int. Cl.⁷ .......................... G06F 17/50; G06T 15/00
(52) U.S. Cl. ...................... 700/98; 700/182; 345/419; 345/964
(58) Field of Search .................. 345/418–420, 345/441–443, 619–622, 964; 700/95–98, 117, 118, 180–185; 703/1, 2

(56) References Cited

U.S. PATENT DOCUMENTS

| | | | |
|---|---|---|---|
| 4,912,644 A | 3/1990 | Aoyama et al. ............. 700/98 |
| 5,237,647 A | 8/1993 | Roberts et al. ............ 345/419 |
| 5,396,265 A | 3/1995 | Ulrich et al. ............. 345/158 |
| 5,448,687 A * | 9/1995 | Hoogerhyde et al. ....... 345/423 |
| 5,587,914 A | 12/1996 | Conradson et al. .......... 700/95 |
| 5,615,317 A * | 3/1997 | Freitag ................... 345/419 |
| 5,864,482 A | 1/1999 | Hazama et al. ............ 700/95 |
| 5,870,307 A * | 2/1999 | Hull et al. ............... 700/182 |
| 5,905,507 A * | 5/1999 | Rossignac et al. ......... 345/440 |
| 5,969,973 A | 10/1999 | Bourne et al. ............. 700/165 |
| 5,971,583 A | 10/1999 | Ohnishi et al. ............. 700/98 |
| 6,144,896 A | 11/2000 | Kask et al. ................ 700/182 |
| 6,185,476 B1 | 2/2001 | Sakai ....................... 700/182 |
| 6,198,979 B1 * | 3/2001 | Konno ....................... 700/98 |
| 6,256,595 B1 | 7/2001 | Schwalb et al. ............. 703/1 |
| 6,272,447 B1 | 8/2001 | Gavin et al. ................ 703/1 |
| 6,411,862 B1 | 6/2002 | Hazama et al. ............. 700/182 |
| 6,493,603 B1 | 12/2002 | Haeberli .................... 700/182 |
| 6,507,767 B2 * | 1/2003 | Bourne et al. .............. 700/165 |
| 6,553,337 B1 * | 4/2003 | Lounsbery ................... 703/2 |
| 6,718,291 B1 * | 4/2004 | Shapiro et al. .............. 703/2 |
| 6,720,963 B2 * | 4/2004 | Yoshida et al. ............. 345/420 |
| 2003/0033041 A1 | 2/2003 | Richey ....................... 700/98 |
| 2004/0073469 A1 * | 4/2004 | Emori et al. .................. 705/8 |

OTHER PUBLICATIONS

"Automated Fabrication", Marshall Burns, (PTR Prentice Hall, 1993), title page, pp. 322–323, © 1993 Ennex™ Corp.
"Bend the Rules of Structure", by Peter Hall, Metropolis magazine, Jun. 2003.

(List continued on next page.)

*Primary Examiner*—Maria N. Von Buhr
(74) *Attorney, Agent, or Firm*—Stiennon & Stiennon (57) ABSTRACT

A free form source model is divided into surface sections by identifying external boundary edges and internal boundary edges. The boundaries are connected or further divided as necessary to achieve a perimeter about each surface section which is a single closed curve. Doubly curved surfaces may also be subdivided. A developable output surface which approximates each source model surface section is then determined by calculating the minimum cost triangulation of each source model perimeter. Costs to be minimized may include the deviation of the triangle surface normal from the edge normal, the degree of bending between adjacent triangles, or the departure of the approximated surface from the original surface. The two-dimensional boundary of the flattened surface guides fabrication of output segments from sheet material, which may be assembled into an output object comprised entirely of developable surfaces.

27 Claims, 8 Drawing Sheets

OTHER PUBLICATIONS

"Planar Layout (Prisa) of Freeform Models", by Gersho Elber, website printout http://www.siggraph.org/s98/conference/teapot/prisa.html May 16, 2003.

"Creating Models of Truss Structures with Optimization", by Jeffrey Smith, Jessica Hodgins, Andrew Witkin and Irving Oppenheim, ACM SIGGRAPH conference proceedings, no date.

"PRISA", website printout, http://lumimath.univ-mrs.fr/~jlm/cours/irit70/node1143.html May 29, 2003.

"Model fabrication using surface layout projection" by Gershon Elber, Computer-Aided Design, vol. 27, No. 4, pp. 283-291, 1995.

"Direct WYSIWYG Painting and Texturing on 3D Shapes," Pat Hanrahan and Paul Haeberli, *Computer Graphics*, vol. 24, No. 4 , Aug. 1990, pp. 215-223, © 1990 ACM-0-8791-344-2/90/008/0215, copying by permission of the Association for Computing Machinery.

"Triangulation of a Convex Polygon" http://www.cs.rutgers.edu/~djimenez/ut/utsa/cs3343/lecture12.html, no date.

"Rhinoceros® NURBS modeling for Windows" Version 3.0 User's Guide, pp. 500-501, Robert McNeel & Associates, 1993.

* cited by examiner

FABRICATION OF FREE FORM STRUCTURES FROM PLANAR MATERIALS

CROSS REFERENCES TO RELATED APPLICATIONS

Not applicable.

STATEMENT AS TO RIGHTS TO INVENTIONS MADE UNDER FEDERALLY SPONSORED RESEARCH AND DEVELOPMENT

Not applicable.

BACKGROUND OF THE INVENTION

The present invention relates to methods for producing free form structures in general, and more particularly to methods for assembling free form three dimensional objects from sheet material.

Computer Aided Design (CAD) software enables a designer to create mathematical models of objects or structures which can be readily viewed on a display, modified, and analyzed. Modem CAD software gives a designer the ability to create any shape imaginable. These models, which are not limited to elemental shapes such as cubes and spheres, are known as free form models, and give free rein to the imagination of the designer and the specific requirements of the project. The appearance of the free form model is clearly and accurately displayed at any desired magnification on a video display.

Generation of actual three-dimensional output objects from the free form CAD source models presents a challenge. If the object is ready for production, the CAD source model can be used to create cutting paths for a multi-axis milling machine which can produce the free form object as a machined part, or a mold can be produced for generating the part in a polymer material.

If the output object is relatively small (usually smaller than a cube two feet on a side), it may be produced by stereolithography, selective laser sintering, or other similar technique which builds up an object or a mold for the object from a series of layers. Various approaches are set out in Automated Fabrication, Marshall Burns, (PTR Prentice Hall, 1993). These techniques, however, are limited in the size of object which can be produced, in the materials used, and generally require costly equipment to implement. These options are costly, and may not be economically employed for custom or large scale objects.

Some source models are especially suited to being constructed from sheets of material. For example, if the model is comprised entirely of planar shapes, it might be assembled from sheets of cardboard or plywood cut to shape and fastened together. More complex shapes can be produced in this manner if the sheet material is capable of being bent. For example, a cylinder is readily constructed from a bent thin sheet. Surfaces which can be produced by bending or folding a sheet, but without stretching, are known as developable surfaces. If the designer employs a CAD program which is constrained to produce models using only developable surfaces, such as disclosed in my U.S. Pat. No. 6,493,603, the disclosure of which is incorporated by reference herein, the developable surfaces of the three-dimensional source model may be flattened, cut out from sheet material, and assembled into a corresponding output object. However, this approach requires modified CAD software, and undesirably places limits on the designer from the beginning of the design creation.

Gershon Elber, of the Department of Computer Science, Technion, Israel Institute of Technology, has described a software approach which decomposes a free form three-dimensional model into piecewise developable surfaces. In this system, a sphere, for example, can be rendered as a series of narrow strips which can be cut from sheets and assembled into an approximation of the sphere. What is needed however, is a system for producing free form three-dimensional structures out of sheet materials formed into developable surface elements, and yet which would provide optimal design latitude to the designer, would minimize the number of elements required, and would offer a range of readily selected creative options to the designer in controlling the conversion of the free form model into the developable surface output object.

SUMMARY OF THE INVENTION

The process of this invention produces instructions for forming a three-dimensional object which can be assembled from planar elements of sheet material. The elements are determined such that, when they are assembled, the element surfaces are exclusively developable surfaces. The process begins with a free form source model which may have sharp edges and doubly curved surfaces, as well as developable surfaces. The free form source model is divided into surface sections by identifying external boundary edges and internal boundary edges. Boundary edges may be determined, for example, where surface normals between two adjacent surfaces differ by some selected tolerance, or where a surface is abruptly terminated. The boundaries are connected or further divided as necessary to achieve a perimeter about each surface section which is a single closed curve. Doubly curved surfaces may also be subdivided. Each surface section perimeter is sampled and represented as a series of vertices in three-space connected by edge segments to create a perimeter polygon. A developable output surface which approximates each source model surface section is then determined by calculating the minimum cost triangulation of the perimeter polygon of each surface section. The cost of each triangulation is determined by using functions which either relate the triangles of the triangulation to each other, or to some attribute of the source model surface section, or relate to an innate attribute of the triangles. The function or functions used to assign costs to the triangulations are selected to determine a triangulation which is most satisfactory in terms of the end result desired. A number of factors may be considered as costs to be minimized, including the deviation of the triangle normal from the surface normal at the perimeter, the degree of bending between adjacent triangles, and the departure of the triangulated surface from the original source model surface section. The minimum cost triangulation is carried out as a process which may be assisted by dynamic programming methods. Once the minimum cost triangulation has been determined for each output surface, the triangulated surface is flattened and the two-dimensional boundary is determined. This output surface boundary may be provided as instructions to a cutting tool, or as printed outlines on planar sheet material which thereby permits the output segments to be cut from the sheet material and assembled into an output object comprised entirely of developable surfaces.

It is a feature of this invention to provide a method for producing three-dimensional objects formed entirely of developable surfaces which approximate a source model surface.

It is another feature of this invention to provide a method for approximating a doubly curved surface with two or more developable surfaces.

It is a further feature of this invention to provide a method of forming planar structural material into shapes which approximate free form surfaces.

It is also a feature of this invention to provide a method of dividing doubly curved surfaces into developable surfaces along arbitrary subdividing lines entered by a user.

Further objects, features and advantages of the invention will be apparent from the following detailed description when taken in conjunction with the accompanying drawings.

DESCRIPTION OF THE PREFERRED EMBODIMENTS

Figure 1:
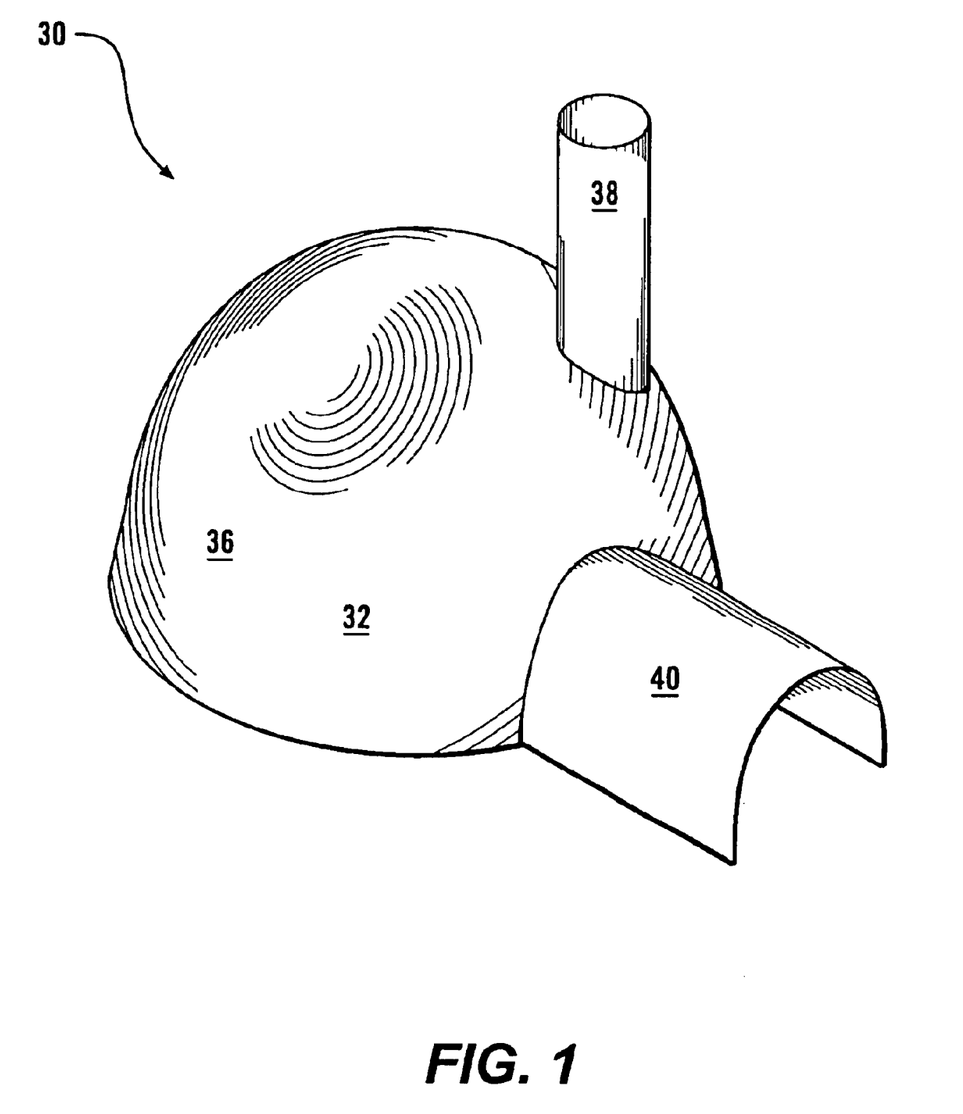
FIG. 1 is a perspective view of a free form source model roughly in the shape of an igloo.

Referring more particularly to FIGS. 1-32, wherein like numbers refer to similar parts, a representative free form source model 30 is shown in FIG. 1. The source model 30 is a free form surface, which is to say it may have sections which are planar, developable surfaces, or doubly curved surfaces, and the surfaces may be continuous or discontinuous, or may adjoin at sharp or smooth edges. The source model 30 of FIG. 1 is illustrated as being generally in the shape of an igloo with a chimney, and is provided as an example only, having a variety of surface features. The process of this invention determines an approximation of the source model 30 surface 32 which is comprised entirely of output surface elements which are developable surfaces and which can thus be fabricated from planar sheet material.

Figures 2, 3:
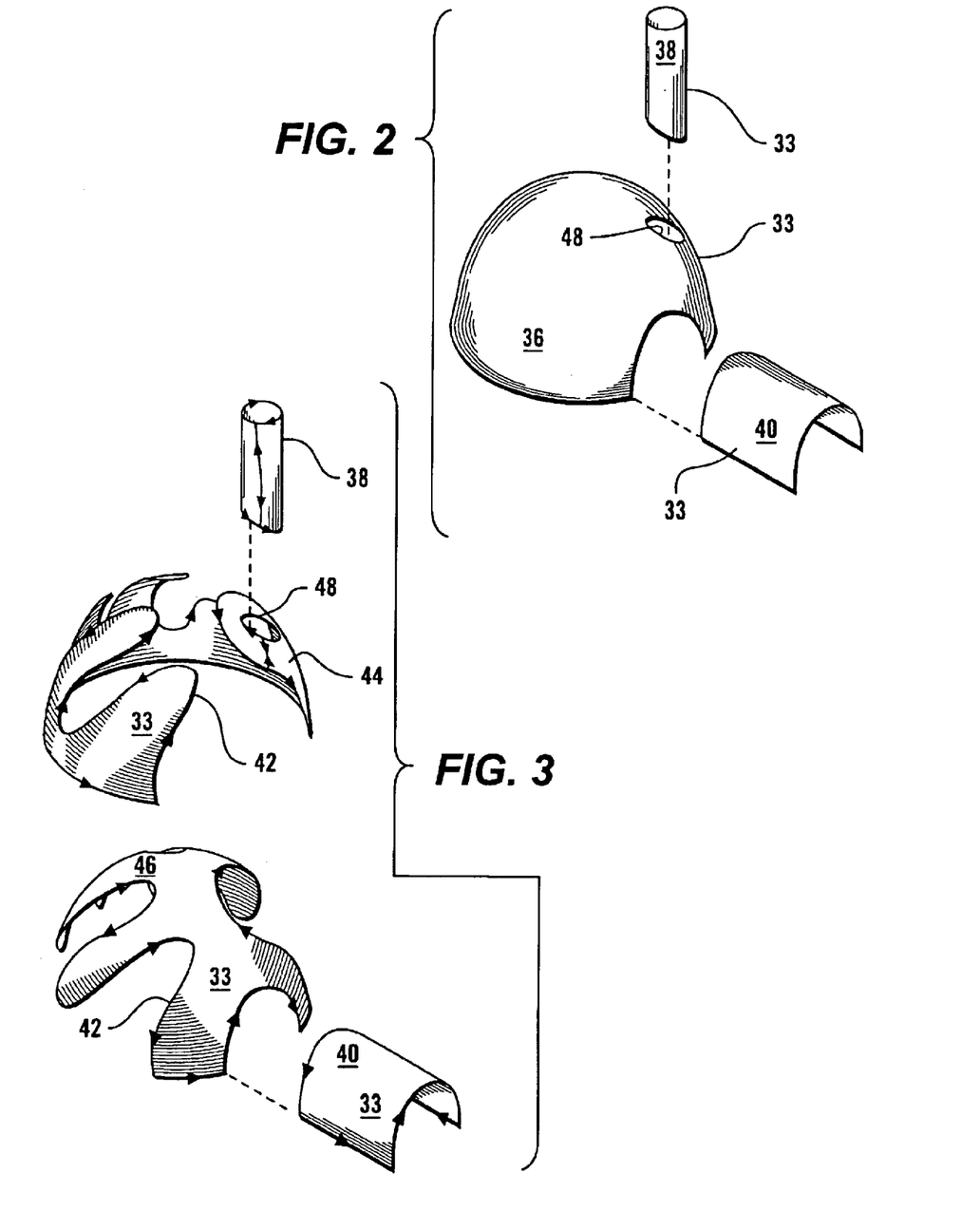
FIG. 2 Is an exploded perspective view of identified surface sections of the source model of FIG. 1.
FIG. 3 is an exploded perspective view of the identified surface sections of the igloo with divisions added to the surfaces which have more than a single closed curve or which are doubly curved.

The source model 30 may be considered as a physical model, or as a 3-D geometric model described by surface patches, general polygons, triangles, or other geometric description. The source model surface 32 is divided into surface sections 33, as shown in FIG. 2. For this process, the source model surface may be converted to a surface of many small triangles, the number of triangles determined by the degree of resolution required. This source model representation is comprised of many surface approximation vertices identified in 3-space, which each may be identified in a three-dimensional coordinate system, generally in x, y, z coordinates in a Cartesian coordinate system. Each perimeter of a surface section, when approximated by the connected vertices is a perimeter polygon composed of line segments which connect the vertices. The perimeter polygon is a closed shape in 3-space comprised of vertices which each correspond to a point on the source model surface section, and which are connected by line segments.

Although the process will be discussed in a fashion which would permit of manual calculation, it is expected that the process will be implemented entirely in a computer, as the number of calculations is very great for any but a perimeter polygon with only a few sides. Advantageously, the process can be implemented in connection with a graphical user interface. The interface may display the source model and its surface, and provide various options for breaking the source model down into developable surfaces; and provide options for creation of the final output surface of the model composed of developable surfaces.

Any triangle defines a plane, and the surface normal to that plane is a vector which extends perpendicular to this plane. This vector is readily determined by taking the cross product of vectors corresponding to any two of the legs of the triangle. For comparison of triangle surface normals without regard to the relative sizes of the triangles, the surface normals are all made to be the same unit length in whatever direction they extend.

Surface sections of the source model which are suited to being fabricated from a single developable surface may be identified. Thus the source model surface may be split where there are discontinuities in the surface. An external boundary is defined where there is no adjacent surface to a surface section edge. An internal boundary can be defined as desired, for example where there is a change in orientation between surfaces which is greater than some desirable level.

The change in orientation between surfaces indicates an edge or discontinuity between surface sections.

Together, the internal boundary edges and the external boundary edges of the source model define between them the surface sections 33 of the source model surface 32. Each surface section 33 is bounded in three-space by a perimeter forming a closed curve in three-space. As shown in FIG. 2, the igloo free form surface 32 is separated into three surface sections 33, a semispherical section 36 corresponding to the body of the igloo, a cylindrical section 38 corresponding to the chimney, and a semicylindrical section 40 corresponding to the igloo entryway.

In order to obtain a satisfactory approximation of a doubly curved surface, such as the semispherical surface 36, the surface should be divided. For division of the surface into at least two surface sections, a line may be extended from a first point on the perimeter to a second point on the perimeter which is spaced from the first vertex. As shown in FIG. 3, this subdividing line 42 may be an arbitrary curve and may be generated automatically by a software routine, or may be entered by a user through a computer interface which, for example, permits the user to draw with a mouse or a stylus on the three-dimensional surface section. The subdividing line 42 divides the doubly curved surface section 36 into two doubly curved surface sections 44, 46. The greater the length and the number of lobes of the subdividing line, the better the opportunities for the creation of a developable surface which is a good approximation of the original doubly curved surface. It should be noted, however, that a doubly curved surface may be cut or divided internally without forming multiple surface sections. To achieve a division without increasing the number of surface sections, a line may be extended from a first point on the perimeter polygon into the interior of the surface section and return along the identical path to the same first point. A single surface section may have multiple lines of this type in which the starting point and ending point are the same. It should be noted that a line beginning and ending at the same point could also be used to divide the surface section into two parts by not having the path double back on itself.

It should be noted that the subdividing of the doubly curved surfaces by the user provides ample opportunity for creative expression, in that the subdivision may be detectable in the output object. The subdivision lines may be meandering lines of no graphical meaning, such as those shown in the figures, or iconic, such as an outline of some creature, or even script characters or logos. Closed looped surfaces, such as the cylindrical chimney section 38 must also be split by a boundary edge to permit the closed surface to be opened and laid flat. These splits may be generated automatically, or with the intervention of the user.

Each surface section 33 should be bounded by a single perimeter which is a closed curve. If a surface section is defined by multiple curves, such as the semispherical section 44 which has a circular opening 48, an internal boundary is arbitrarily created which joins the curves into a single continuous closed perimeter. In the surface section 44, the circular opening 48 is connected to the external boundary edge of the surface section. Although the vertices are not shown in FIG. 3, the order of the vertices on the perimeter polygon may be assigned by employing the right hand rule to determine what is the interior of a surface section, and what is the exterior. Based on the surface normals of the vertices along the surface section perimeter polygon, the right hand rule is used to determine the direction of vertices in the perimeter polygon, as illustrated by the arrow heads in FIG. 3. The result is, as you travel around the perimeter polygon, the enclosed surface section is on the left, and the exterior is on the right, when viewed from the outside of the surface section.

In some special cases, it may be necessary to add additional subdivisions to surface sections, for example in those cases where the surface sections are too large to be formed from the available unit sizes of sheet material, or where the flattened surface sections will generate self-intersecting cut paths. The software implementation of the process may either call the user's attention to these potential difficulties and allow the user to select appropriate subdivisions, or may suggest a proposed subdivision.

Any polygon can be represented by connected triangles, in which chords of the triangles extend between the vertices of the polygon. So long as the chords do not intersect, such an arrangement of triangles can be flattened, and folded along the chords to define the original shape in three-space. The process of connecting the vertices of a polygon to define non-intersecting triangles is known as triangulation. Because a triangulated surface in three-space can be flattened without any stretching or compression, it is a developable surface. Hence, to find a developable surface which approximates the source model surface section, a triangulation is performed on the perimeter polygon. The triangulation will be a set of triangles which are connected to each other along a side, which do not overlap, and in which each triangle vertex is also a vertex of the polygon which is being triangulated. The triangulation will thus define a surface which fills the polygon being triangulated.

Whatever the source model's original form, for the following process the perimeter must be approximated by a series of straight-line segments connecting vertices. The number of vertices accorded a particular curved section may be chosen as desired, with a greater number of vertices being employed where greater fidelity to the perimeter source shape is required, or where the perimeter has a more complicated shape. The result is a perimeter polygon consisting of vertices connected by edges.

Any closed perimeter in three space can be fit with a developable surface. If triangles are defined which extend between vertices of the perimeter polygon, that triangulated surface will be a developable surface and so readily flattened. Therefore, in order to produce a developable surface corresponding to an arbitrary free form surface section, a triangulation of the surface involving triangles which extend between vertices on the perimeter polygon must be found. However, for most satisfactory results it is not enough to find just any developable surface—as there are many developable surfaces which will share a single perimeter polygon—rather, the chosen developable surface should be selected to be a good approximation of the original source model surface section.

The goal of the triangulation is to determine the optimal approximation of the surface section by triangles which define an output surface element which can be "unfolded" into a planar polygon. As noted, it is an attribute of any developable surface which has a closed perimeter, that it can be divided by fold lines which extend between two vertices on the perimeter. Once these fold lines are identified, the regions of the surface between the fold lines can be treated as planes, and the entire surface can be flattened by rotating each plane about its adjacent fold line until all the portions of the surface lie in a common plane.

However, although any triangulation surface section can be unfolded, there are many triangulations which are very poor approximations of the source model surface section.

This process determines an optimal triangulation which gives the most satisfactory representation of the original source model as an assembly of developable surfaces. The optimal triangulation is ascertained by determining a lowest-cost breakdown of the source model surface section into an output surface. It should be noted that there is generally no single solution to the triangulation problem, as there are many triangulations which may be of equal cost. Moreover, because the output object surface will generally only be an approximation of the original source surface, there may be some user involvement in determining which of the possible optimizations are more desirable from an aesthetic, fabrication, or economic standpoint.

The optimization may give weight to one or more attributes of each possible triangulation. In general there are three types of functions which may be considered: functions which relate one triangle to one or more of the other triangles, functions which relate only to one triangle, and functions which relate some aspect of the triangle to some aspect of the source model surface section 33.

An example of a function of the first type may involve comparing the degree of bending between two adjacent triangles, and assigning an energy cost of surface bending. Examples of the second type of function would be one relating to the angles between the edges of a single triangle or the area of a single triangle or the total length of the sides of a single triangle. Examples of the third type of function would be functions relating to comparing the triangle surface normal to the surface normals of the source model surface section; or a function relating to comparing the deviation of the triangle from the source model surface section. Generally, the functions best employed are those that can be related to some desirable outcome in the output structure surface, for example minimizing the energy cost of surface bending involves minimizing the angular displacement between the surfaces of adjacent triangles in the triangulation, to result in less bending of the output structure elements. Minimizing the cost of edge matching involves minimizing the difference between the surface normal of a triangle in the output surface and the edge normals of the source surface section 33 along the same edge, more closely matching the shape of the source model surface section.

Just one of these functions, or two or more may be employed to determine an optimum triangulation. However, it has been found that good results are achieved when only the costs of edge matching and energy cost of surface bending are considered, and the process as discussed below will only consider those two attributes, with an understanding that a greater or lesser number of attributes could be considered.

Figure 26:
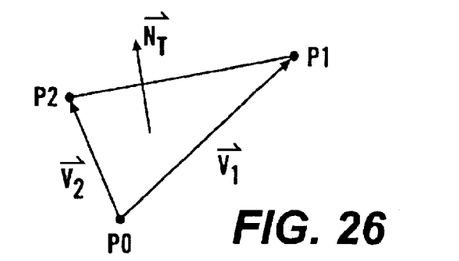
FIG. 26 is a schematic view of a representative triangle illustrating the calculation of a triangle surface normal.
Figure 27:
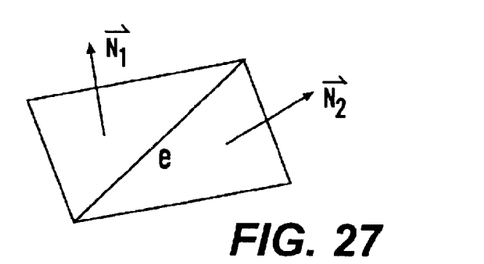
FIG. 27 is a schematic view of two adjacent triangles illustrating the calculation of bend cost.

To calculate a triangle surface normal, the cross product of two vectors corresponding to two sides of the triangle is determined, as illustrated in FIG. 26. The surface normal is this vector reduced to a unit vector by dividing it by its own magnitude:

$\vec{V}_1 = p_1 - p_0$ $\vec{V}_2 = p_2 - p_0$ $\vec{C} = \vec{V}_1 \times \vec{V}_2$ $\overline{N}_T = \frac{\overline{C}}{|\overline{C}|}$ The bend cost between two triangles sharing a common edge may be calculated by finding the surface normals for the two triangles, as shown in FIG. 27, then finding the magnitude of one surface normal subtracted from the other to determine the BendDelta, the BendCost is this value taken to a power greater than one, preferably a high power, for example the fifth power, then multiplied by the length of the edge between the triangles:

$\vec{N}_1$ is the surface normal of a first triangle $\vec{N}_2$ is the surface normal of an adjacent triangle BendDelta=$|\vec{N}_1 - \vec{N}_2|$ BendCost=length($e$)·BendDelta$^5$ It should be noted that, in general the BendCost may be determined as some function of the length e and the BendDelta.

Figures 28, 29:
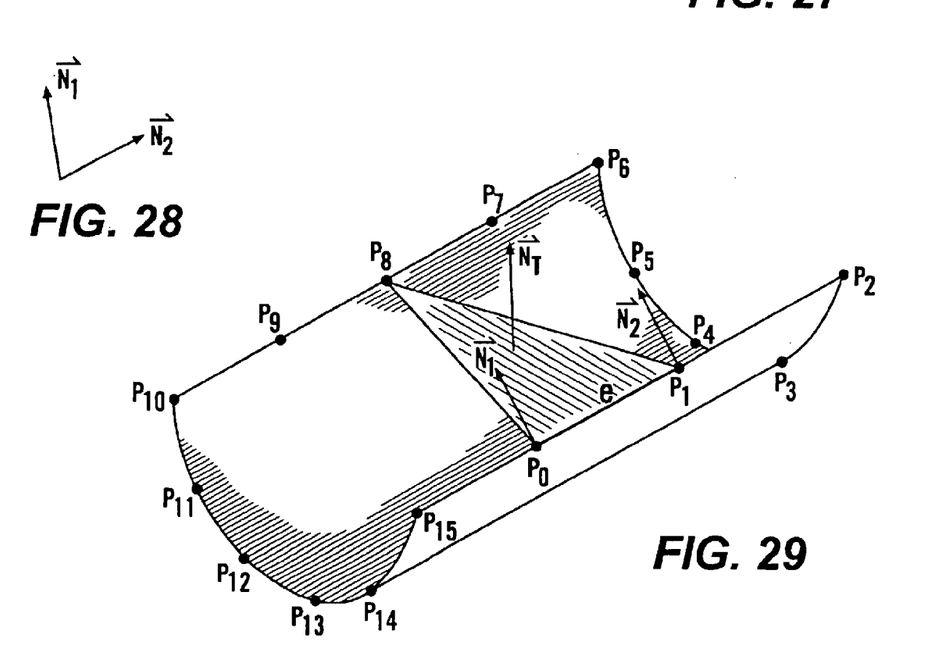
FIG. 28 is a schematic view showing the subtraction of the surface normals of two adjacent triangles to determine the BendDelta value.
FIG. 29 is a schematic view of a perimeter with a test triangle connecting three vertexes, illustrating the calculation of edge cost.

The edge cost may be calculated as illustrated in FIG. 29. When a test triangle $p_0$-$p_1$-$p_8$ is considered, normals of the source model surface section at each end of the edge e are determined. The average surface normal along the edge is determined by dividing the sum of the these normals by their magnitude. An EdgeDelta is found by subtracting this average edge normal from the surface normal of the test triangle and finding the magnitude of this vector. The edge cost may be calculated as the length of the edge e times the EdgeDelta taken to the fifth power:

$\vec{N}_1$ is the surface normal at $p_0$ $\vec{N}_2$ is the surface normal at $p_1$ $\overline{N}_{avg} = \frac{\overline{N}_1 + \overline{N}_2}{|\overline{N}_1 + \overline{N}_2|}$ EdgeDelta=$|\vec{N}_T - \vec{N}_{avg}|$ EdgeCost=length($e$)·EdgeDelta$^5$ It should be noted that, in general the EdgeCost may be determined as some function of the length e and the EdgeDelta.

It should be noted that other costs than those discussed above may be taken into account in arriving at a lowest cost triangulation. For example, it may be desirable to consider costs such as the area of the triangles, and the edge length of the triangles, in addition to or in place of some of the cost factors discussed above. For example, if it were desired to construct an object as a space frame, or as a flexible material supported on a space frame, for ease of construction it would be desirable to limit obtuse angles in the connecting struts of any such space frame, a cost may be assessed based on the maximum or minimum angle defined within each triangle of a triangulation. Alternatively, it might be desirable to take into account the area of the approximation triangles, for example if it is desired to find the triangulation which requires the smallest quantity of flexible material to be used.

In order to determine the optimized or low cost triangulation, in effect, every possible triangulation is considered, and the costs of that triangulation are weighed. This evaluation of multiple triangulations may be carried out in a variety of fashions. Conceptually, one can contemplate all the possible triangulations laid out for analysis, with the desired cost functions applied to each triangulation one after the other. The triangulations are considered and compared one to the other. Each time a lower cost triangulation is found, the higher cost possibility is discarded, until there is left only triangulations of the lowest cost. However, with polygons having more vertices, more advanced optimization techniques may be desired to reduce processing time. The following example employs dynamic programming methods to perform the analysis. The example employs the simple case of a perimeter polygon which has nine vertices, and is illustrated in FIGS. 7-23. The perimeter polygon is defined by a number of vertices which are spaced along the polygon, the vertices being connected by edge segments. In the figures, the vertices are numbered 0–8. Line segments which connect two adjacent vertices, and which hence lie on the perimeter polygon, are edge segments. Line segments which extend between non-adjacent vertices, and which hence cut across the surface section are referred to as chords. A triangle will be bounded by three line segments.

Figure 7:
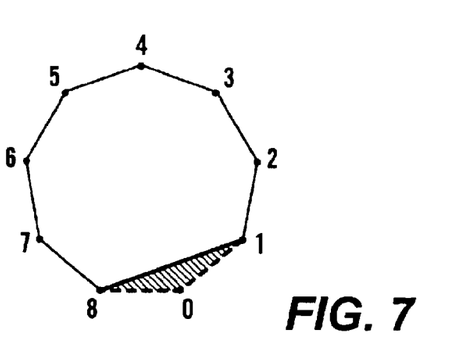
FIGS. 7-13 are schematic views of a representative perimeter polygon, illustrating the identification of all the possible triangles formed with a single edge segment.

As shown in FIG. 7, an arbitrary edge segment 8-0 is selected, and then all the possible trial triangles which can be formed with that edge segment are considered. The first trial triangle 8-0-1 has two edge segments 8-0, and 0-1, and a chord 1-8. For each trial triangle thus formed, the polygon will be divided into three regions: the trial triangle itself, a polygon to the left of the triangle, and a polygon to the right of the trial triangle. In FIGS. 7-23, trial triangle edge segments are shown in dashed lines while chords are shown as dark lines.

In the case of the trial triangle 8-0-1, shown in FIG. 7, there is no polygon to the right, so only the costs of the trial triangle 8-0-1 and the left remainder polygon 8-1-2-3-4-5-6-7 need to be considered. The cost of the trial triangle 8-0-1 is calculated by first determining the edge cost of the edge segment 8-0. The edge cost considers the difference between the surface normal of the trial triangle and an average of the edge normals of the vertices on the source model surface section at that edge. This cost may be assessed without regard to direction of the variance by taking the length of the vector which extends between the compared normals. In a similar manner, the edge cost of the edge segment 0-1 is calculated.

Next the bending cost at each chord is determined. The bending cost is a function of the difference between the surface normal of the trial triangle and the surface normal of the adjacent triangle. The value of this difference may be calculated, as discussed above with respect to the calculation of the edge normal cost, by considering the surface normals of the trial triangle and the adjacent triangle positioned as if they were at a common origin, and taking the length of the vector extending between the two surface normals. It will be observed however, that it is not possible to calculate the surface normal of the adjacent triangle until it is known how the remainder polygon itself will be triangulated.

Figure 8:
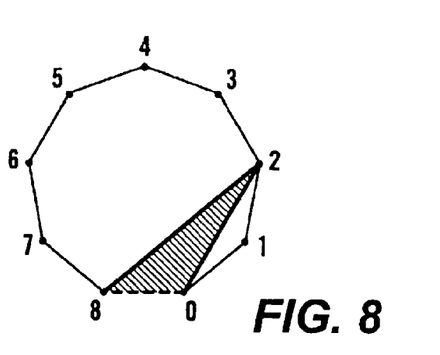

Thus it will be necessary to determine a low cost triangulation of the left remainder polygon before determining the bending cost of the trial triangle. And of course, the determination of a low cost triangulation of the left remainder polygon requires a consideration of all the possible subpolygons of that shape. This determination is more readily illustrated beginning with the simpler case of a remainder polygon of only three sides, such as shown in FIG. 8. The trial triangle 8-0-2 divides the perimeter polygon such that there is a left remainder polygon of seven sides and a right remainder polygon of three sides. As illustrated schematically in FIG. 14, the right remainder polygon is a triangle 0-1-2. Because there is no alternative triangulation of the right remainder polygon, the edge cost and bending cost of the right remainder polygon is calculated as discussed above, and, with the right remainder polygon determined it is possible to calculate the bending cost at the chord 0-2 for the trial triangle 8-0-2.

Figure 9:
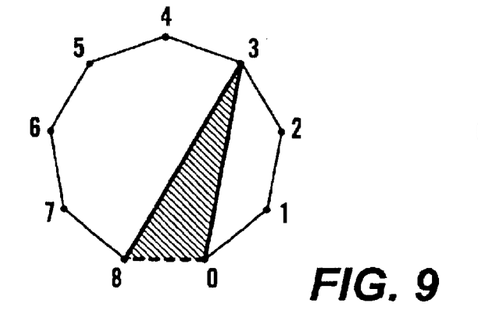
Figure 15:
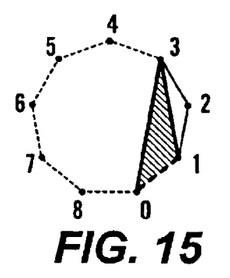
FIGS. 15-16 are schematic views illustrating the triangulation of a remainder polygon corresponding to the selected triangle of FIG. 9.
Figure 16:
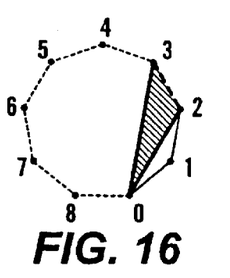

A more complicated situation, in which the right remainder polygon may be triangulated in more than one fashion is illustrated in FIGS. 9, and 15-16. As shown in FIG. 9, The trial triangle 8-0-3 divides the perimeter polygon to produce a left remainder polygon 8-3-4-5-6-7 and a right remainder polygon 0-1-2-3. In order to determine the bending cost along the chord 0-3 of the trial triangle it is necessary to determine how the right remainder polygon is itself triangulated. As shown in FIG. 15, the right remainder polygon is first divided into the triangle 0-1-3 with the remaining triangle 1-2-3. The edge costs and bending costs are determined for this triangulation—then the edge costs and bending costs are determined for the alternative triangulation comprised of the triangles 0-2-3 and 0-1-2, as shown in FIG. 16. The lowest cost alternative is selected, thereby permitting the bending cost of the trial triangle 8-0-3 to be calculated with respect to the adjacent triangle within the right remainder polygon.

Figure 10:
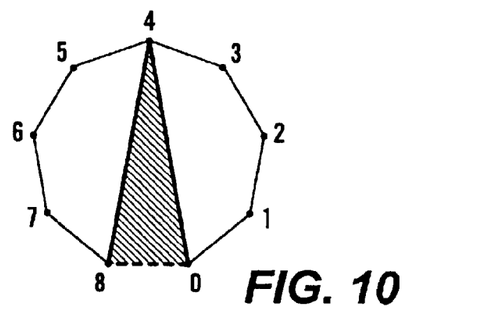
Figure 11:
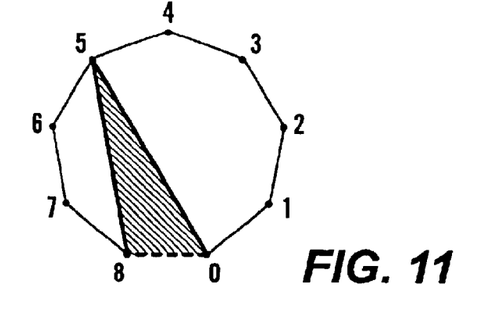
Figure 12:
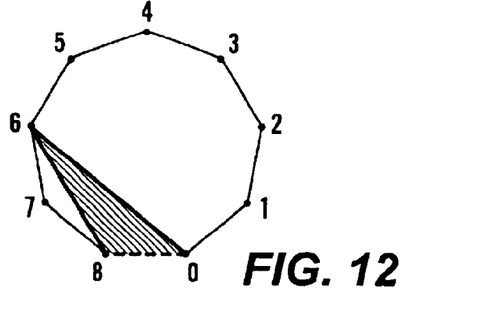
Figure 13:
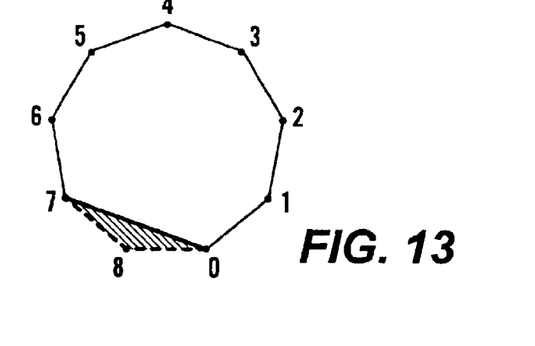
Figure 17:
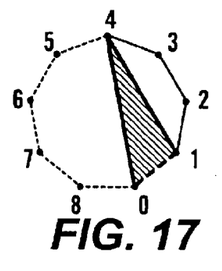
FIGS. 17-19 are schematic views illustrating the triangulation of a remainder polygon corresponding to the selected triangle of FIG. 10.
Figure 18:
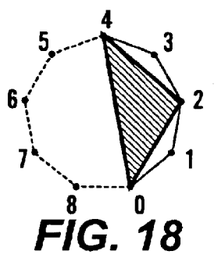
Figure 19:
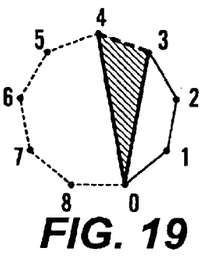
Figure 20:
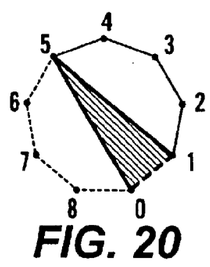
FIGS. 20-23 are schematic views illustrating the triangulation of a remainder polygon corresponding to the selected triangle of FIG. 11.
Figure 21:
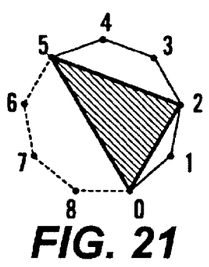
Figure 22:
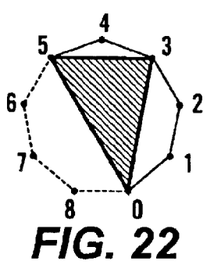
Figure 23:
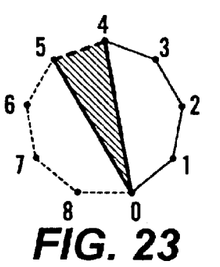

When the trial triangle 8-0-4 is selected, as shown in FIG. 10, both the right remainder polygon and the left remainder polygon are five-sided figures. As shown in FIGS. 17-19, the lowest cost triangulation is calculated for the right remainder polygon in a fashion similar to the process discussed with respect to the trial triangle 8-0-3 shown in FIG. 9. Similarly, when the cost of the trial triangle 8-0-5 is assessed, as shown in FIG. 11, a low-cost triangulation of the right remainder polygon 0-1-2-3-4-5 is carried out as illustrated in FIGS. 20-23. In each case, all possible subdivisions are created, and the least cost subdivision is determined.

The actual calculation of the costs associated with each triangle may be carried out according to a wide variety of functions. For example, if it is desired to minimize the maximum departure of the output object from the source model, rather than the average deviation, the cost calculations may be taken to a higher power before being considered. For example, in computing the bending cost, the magnitude of the difference vector between the two adjacent triangles may be first taken to the fifth power, and then multiplied by the length of the chord. In a similar fashion the edge cost may be taken to the fifth power, and then multiplied by the length of the edge segment. Any higher order function will tend to have the same result, thus giving a greater cost to the solution which has the largest difference.

The triangulation of a polygon is a recursive problem which is well suited to being solved by dynamic programming methods, for example as set out by Prof. Daniel Jimenez in "Lecture 12, Dynamic Programming continued, Triangulation of a Convex Polygon," located at www.cs.rutgers.edu/~djimenez/ut/utsa/cs3343/ lecture12.html, the disclosure of which lecture is incorporated by reference herein.

In a Dynamic Programming method, the cost values and the position of the subdivision and remainder polygons are stored in a two-dimensional array, such that those values can be immediately accessed when required at a later stage of the analysis. For example, the polygon 0-1-2-3 is considered both in analyzing the right remainder polygon of FIG. 9, and when analyzing the right remainder polygon of FIG. 19.

After the polygon 0-1-2-3 has been analyzed, and a low cost triangulation of that polygon determined, it is not necessary to repeat the calculations when that polygon appears as a portion of a later calculated polygon.

Figure 14:
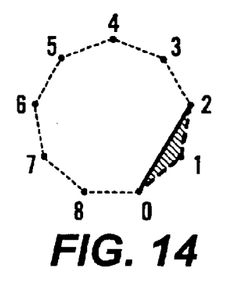
FIG. 14 is a schematic view illustrating the triangulation of a remainder polygon corresponding to the selected triangle of FIG. 8.

Another approach may be considered to obtaining a low cost triangulation which is effectively the same as the approach discussed above, but provides an alternative way of addressing the problem. In the alternative approach, the cost of a triangulation begins by considering a subset of the vertices of the perimeter polygon, for example, the vertices 0-1-2 as shown in FIG. 14. A single triangle has only one possible cost, which is noted, and then an additional vertex is added, vertex 3, such as in FIG. 15, to define a four-sided polygon 0-1-2-3. The possible triangulations of the four-sided polygon are then weighed, and the costs determined. An additional vertex is then added, to define a five-sided polygon 0-1-2-3-4, as shown in FIG. 17, and then another vertex to define a six-sided polygon as in FIG. 20, and so on until the polygon being considered includes all the vertices of the perimeter polygon and is in fact the full perimeter polygon, and all possible triangulations of the entire perimeter polygon are considered and weighed. In the process of reaching the full polygon, the lower cost alternatives will have been noted, and may be employed in making the final calculations.

The perimeter polygon illustrated in the FIGS. 7-23 is a simple example, having few vertices and a surface lying in a single plane. It will be appreciated that perimeter polygons which extend throughout 3-space and which have many more vertices will be accommodated by the process.

It should be noted that although in the illustrated method, all possibilities are examined, it would also be possible to examine only a fraction of the possibilities, or use some stochastic method, instead of doing exhaustive calculations, although a lesser degree of matching the source model surface section might be experienced. In any event, an effective proportion of the total number of triangulation possibilities should be considered to achieve the level of approximation desired.

Figure 4:
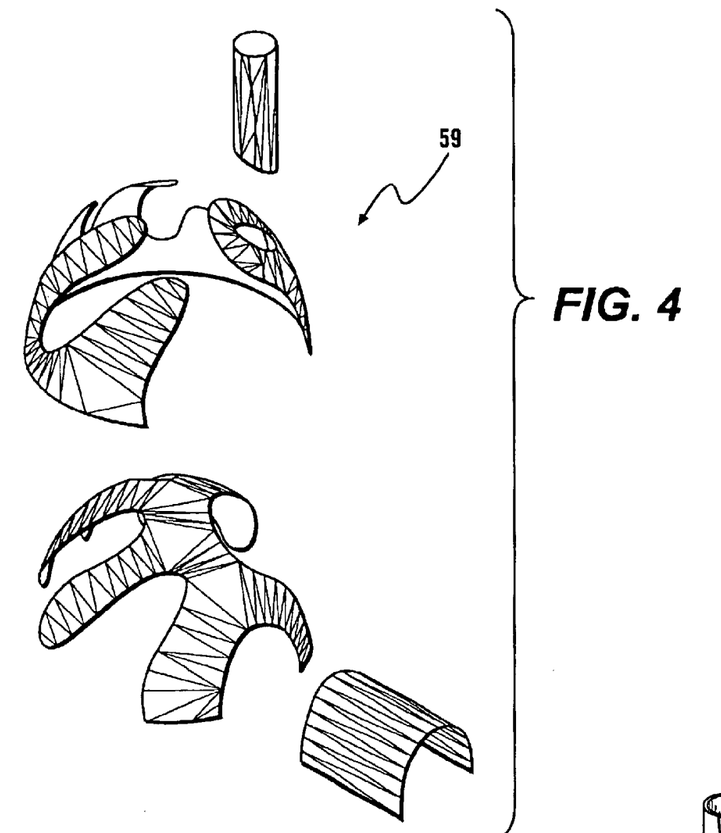
FIG. 4 is an exploded perspective view of approximate surface sections comprised entirely of developable surfaces corresponding to the surface sections of FIG. 3, with the triangulation of the surfaces shown on the surfaces.
Figure 6:
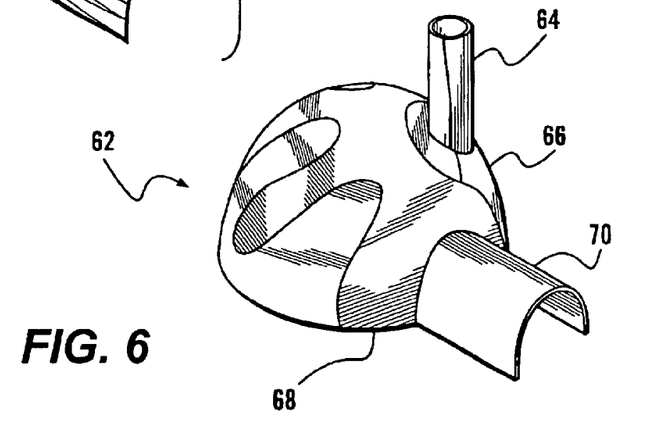
FIG. 6 is a perspective view of an output model assembled from the planar material elements of FIG. 5.

Once a low-cost triangulation 59, as shown in FIG. 4, has been determined, the output surface within the perimeter polygon is flattened, using conventional techniques, to produce an output surface element which extends in a single plane. Each output surface element may then be fabricated from a sheet 60 of material. The output object 62, shown in FIG. 6, is composed of four output surface elements: a first element 64 corresponding to the chimney section 38, a second element 66 corresponding to the igloo dome first subsection 44, a third element 68 corresponding to the igloo dome second subsection 46, and a fourth element 70 corresponding to the igloo entryway 40.

Figure 5:
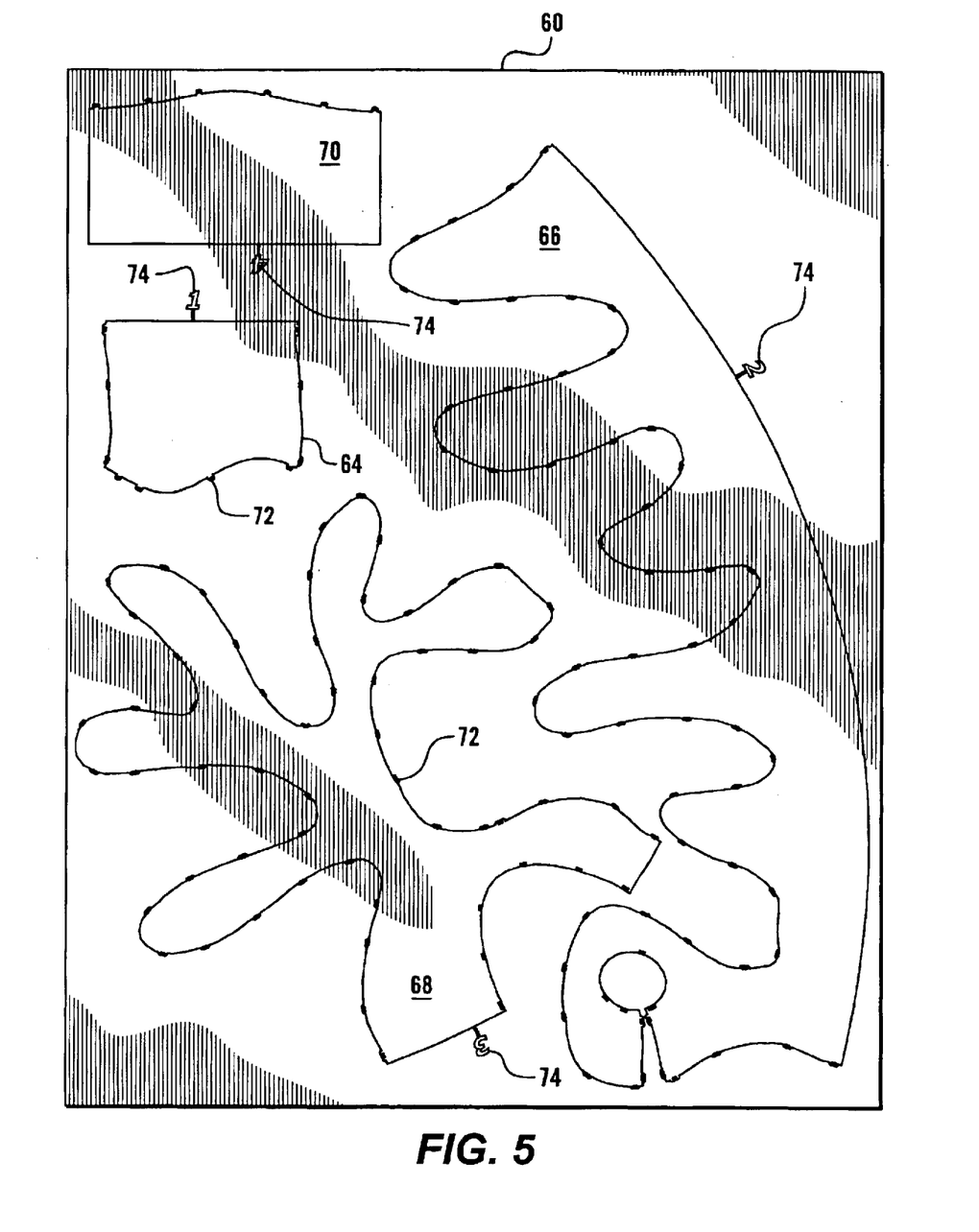
FIG. 5 is a top plan view of a sheet of planar material having cutting paths marked thereon for each element corresponding to one of the developable surfaces of FIG. 4.

The planar output surface elements may be created as images or templates to be applied to sheet material, or as vector or bitmapped graphic files to be reproduced through a printing process, or as instruction sets for driving a laser, a router or numerically controlled cutting machine for fabricating the parts from standard sheet material. The output surface elements may be assembled by a variety of conventional techniques depending upon the sheet material used and the intended purpose of the output object. For example, each output surface element may be provided with a series of tabs 72 having holes therein to permit the output object 62 to be assembled by "stitching" the adjacent tabs of two output surface elements together with wire. In addition, surface element identifying numbers 74 may be fabricated to project from each surface element, as shown in FIG. 5. The numbers 74 will be particularly employed where the elements are not printed upon a sheet but are produced as a cutting path. The numbers 74 help to identify the output surface elements and facilitate assembly of the output surface element, particularly in conjunction with an instruction sheet, which may also be automatically generated. At the time of assembly, the numbers 74 may be cut off from the parts. Software may be used to generate an assembly manual, as well, which provides instructions showing how each numbered part is to be connected to the others.

The output objects 62, although comprised entirely of developable surfaces, can display striking similarity to the original free form model. Because of the simplicity of the parts required, output objects of any desired size can be readily and economically produced. At a very basic and unautomated level, the outlines of the output surface elements may be printed on paper or card stock, cut out by hand, and assembled with glue or adhesive tape. Larger and stiffer structures can be fabricated from sheet plastic, cardboard, or corrugated plastic board. Even larger structures may be assembled from conventional building materials such as drywall, strandboard, plywood, particleboard, wood laminates, or even steel, copper, tin, or titanium sheet. If the perimeters of the output surface elements are connected to one another, and the exterior edges are constrained to their desired perimeter, the output object will be conformed to the desired shape. Because all output surface elements are developable surfaces they need not undergo any stretching or compressing.

The output elements may be connected in various ways, depending on the material used and the strength or stiffness required of the output object. For example, the output surface elements may have projecting tabs for gluing to adjacent elements, or the adjacent elements may be marked with spots indicating where the tabs are to be attached. Another approach is to form narrow protruding tabs on the output surface elements which can be bent with respect to the surface. Tabs of adjacent output surface elements may be brought together and connected with wire. The output surface elements themselves can then be connected along their exterior edges, such as by the application of epoxy or other adhesive, fiberglass, or by welding. The joint may be filled with a fillet of epoxy and filler and the inside and outsides of the joints covered with fiberglass tape which is bonded with epoxy or polyester. Once the surface elements have been permanently joined, the wire-connected tabs can be twisted and broken off, or they may be cut off.

Figure 24:
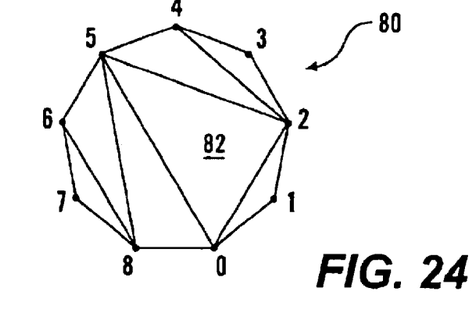
FIG. 24 is a top plan view of a triangulated surface having at least one triangle which is suspended and entirely lacking in edge segments, being comprised entirely of chords.
Figure 25:
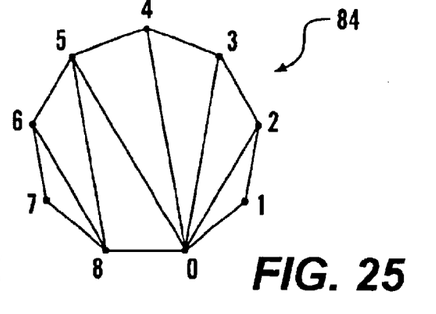
FIG. 25 is top plan view of an alternative triangulated surface, in which each triangle has at least one edge segment.

Although a perimeter polygon 84 might be triangulated such that all the triangles formed have an edge segment, such as shown in FIG. 25, a distinctive feature of the triangulations of this invention is shown in FIG. 24, wherein a surface section 80 has a triangulation which includes at least one suspended triangle 82 which has each of its vertices on the perimeter polygon, but which has no edge sections, being comprised instead of three chords. Such a suspended triangle will often be the most effective way to divide a surface having three legs or projections. Such suspended triangles will also be observed in the triangulation of FIG. 4.

It should be noted that images originally present on the source model can be mapped to the output surface elements, to produce an effective approximation of that image on the output object. In this way the images could be printed on the sheet materials which are to be cut to form the output surface elements. Likewise, the visual boundaries of images on the source model surface may be employed as dividing lines of boundaries of the source model surface sections; i.e.: the outlines of continents on a terrestrial globe could be used as the perimeters of surface sections, and the images of the continents could then be printed on the sheets from which the output elements are formed. Conventional processes for determining correspondence between an original image in a particular shaped region to another differently shaped region may be employed, and conventional techniques for painting and texturing 3D shapes may be employed, such as those disclosed in "Direct WYSIWYG Painting and Texturing on 3D Shapes," Pat Hanrahan and Paul Haeberli, *Computer Graphics*, Vol. 24, No. 4, August 1990, pp. 215–223, the disclosure of which is incorporated by reference herein. Such a method might be used, for example, to fabricate three dimensional models of cartoon characters, complete with coloring to match the appearance of the character in a 3D modeling program.

It should be noted, that, depending on the stiffness of the sheets employed, the output structure will not necessarily be self-supporting, or naturally disposed to maintain the desired output surface. Therefore internal support may be required. This support may take the form of stiff internal braces, air or other fluid pressure, foam, or other structural filler. The internal braces could also be fabricated as sheet elements in the process, as the model in three-space contains the location of the surfaces which require support.

The process may be carried out at least in part by a conventional computer, such as a PC. The software implementation preferably will employ a graphical user interface which will display the source model surface, and will also display a representation of an output object's surface. This display may show a comparison between the original surface and the output object surface, to allow the operator to make an assessment of whether the proposed approximation is adequate. The differences may be shown numerically or graphically, for example by different colors, shades, or intensities. If the proposed approximation is unsatisfactory, the operator can change the parameters guiding the approximation, for example by subdividing the doubly curved surface sections in a different way, or into more subsections, or by choosing different weighting criteria in determining a lowest cost triangulation.

Applications of the method of this invention will be found in a variety of areas where it is desired to fabricate objects of free form design. For example, in interior design, free form walls or other parts of any interior space can be fabricated by cutting wire mesh which is then assembled and covered with plaster, concrete, or stucco. Similarly lathing material, such as used in plaster work, may be cut and bent into wall forms. Large-scale architectural structures may be built out of plastic, plywood, or rebar mesh which is sprayed with concrete. Aircraft parts may be fabricated from aluminum or other aircraft metal. Boat hulls and other boat components can be fabricated from wood or fiberglass. Household objects such as lampshades may be assembled from translucent plastic shells. Articles of clothing and personal adornment such as jackets, hats, pants, and shoes, which are typically fabricated of stitched sheets of leather, suede, fabric, plastic material, etc., can be fabricated to any desired free form shape, even to the extent of being custom designed to the particular body shape of an individual wearer.

Toys, for example stuffed animals and inflatable toys, may be fabricated and readily assembled from sheet materials to match computer models of cinematic, video game, and cartoon characters.

Small scale output objects, such as rings, medallions, earrings, bracelets, and other jewelry, may be fabricated according to the above described method by cutting and folding sheets of gold, silver, or other metal.

Inflatable structures such as driving ranges, tennis shelters, airports, may be assembled from sheet materials, as well as inflatable lighting products.

Forms for casting concrete in free form shapes may be fabricated from sheet materials. Sculptures, signage, for example signs comprised of extruded letters with free form deformations; furniture; dog houses and penthouses; sails, point-of-purchase displays, may all benefit from the process of this invention. Moreover, large storage tanks for liquid or gas, be they mobile or stationary, may be assembled from large sheets of metal cut according to the process of this invention. Other products such as portable lightweight or emergency structures may be produced.

The process is particularly useful where a free form shell is required to be constructed to fit a very particular use and may only be needed in quantities of one or several units, for example: heating and ventilating ducts, shipping containers, and casting molds. Often an item of irregular shape must be shipped in a corrugated cardboard carton which is a regular rectangular box. The process of this invention can be used to cut from cardboard an enveloping output object which has an interior surface which mates with the item to be shipped and an exterior surface that fits readily within the rectangular shipping box.

The ability of this process to generate complicated structures rendered from sheet material makes it particularly adaptable to objects which must be shipped at very low-cost, for example emergency structures, and housing for refugees, displaced persons, and disaster victims. It is often the case that structures of greatly improved stiffness can be fabricated from sheet material when the sheet material is folded or bent. Hence, free form structures which are more economical of materials can be constructed.

In addition, where solid free form objects are called for, the output object comprised of the bent sheet elements may be filled with some structural material such as plastic foam, concrete, resin, etc.

It will be noted that the process of this invention is well adapted to fabrication of objects which are commonly designed using 3-D modeling software, or to fabrication of those objects which require rapid prototyping.

Figures 30, 31:
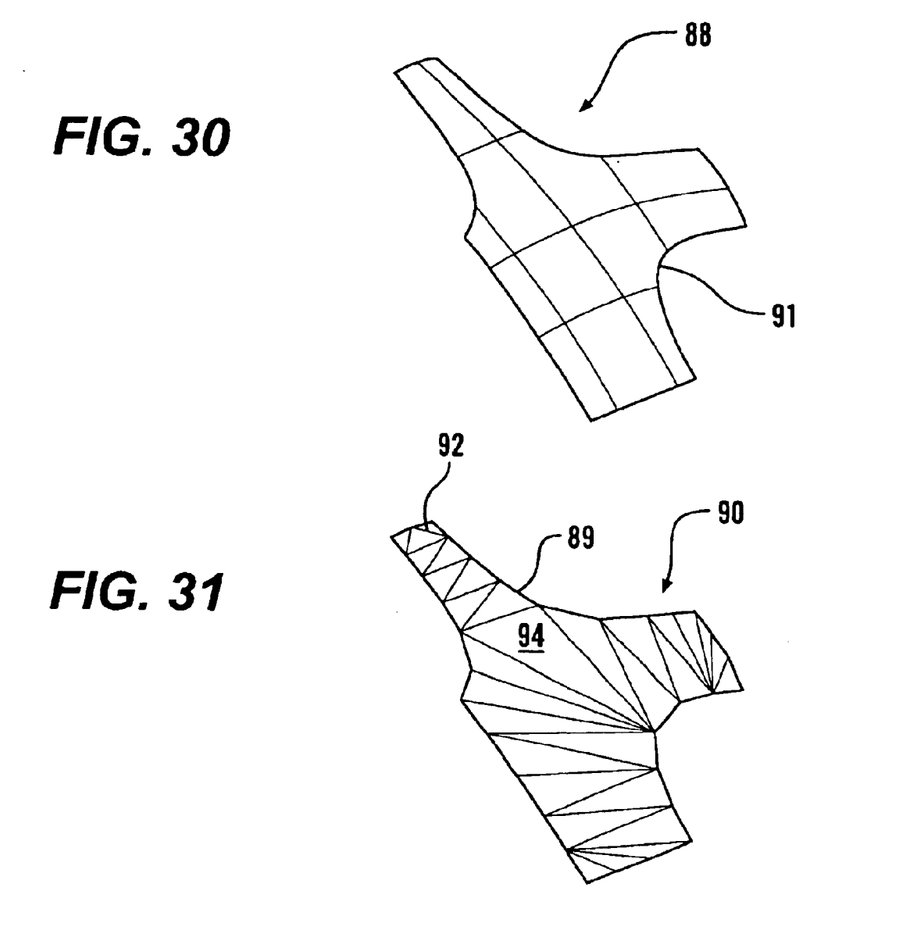
FIG. 30 is a schematic view of a freeform source model surface represented as a NURBS patch.
FIG. 31 is a schematic view of the surface of FIG. 30 represented as a developable surface triangulation according to this invention.
Figure 32:
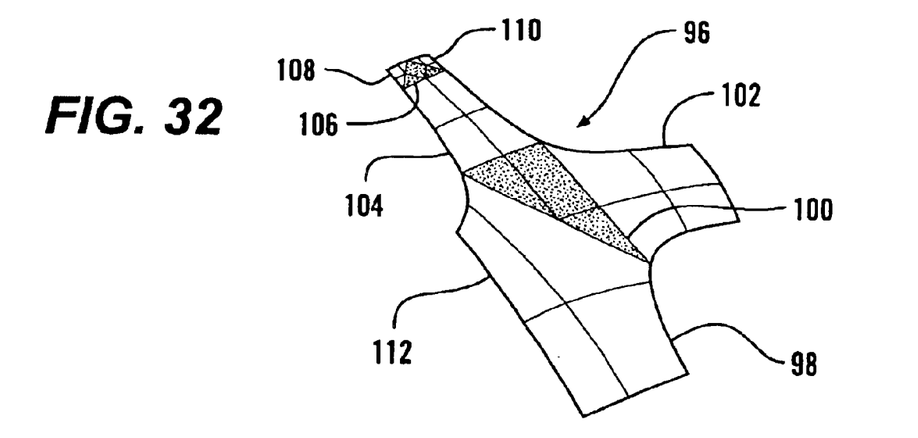
FIG. 32 is a schematic view of the triangulation of FIG. 31 used to divide the source model surface of FIG. 30 into a plurality of NURBS patches, each of which is a developable surface.

An alternative embodiment of the invention is illustrated in FIGS. 30-32. A free form source model surface 88 is shown in FIG. 30 which is represented in a modeling application as one or more surface patches, for example as one or more NURBS patches. NURBS (non-uniform rational B-spline) geometry is a standard approach for representing three dimensional objects or surfaces with very high accuracy. A NURBS patch may represent the curvilinear perimeter 91 of a surface with very high accuracy in a data-efficient manner, as shown in FIG. 30. In the technique of this invention, the surface section perimeter is approximated by a plurality of vertices positioned along the surface section perimeter to define a perimeter polygon 89. Where some edges of of the surface section perimeter 91 are curved, there will be a loss of information in this transition to the perimeter polygon 89. In some applications requiring high levels of accuracy, for example free form computer modeling of tools or production parts, it is desirable to retain all the original perimeter information until such time as the free form model is output in its final form. NURBS patches are one approach to doing this. Advantages may be obtained by representing a single NURBS patch as one or more NURBS patches which are each a developable surface.

The optimal triangulation of the NURBS patch 88 is found in just the same fashion as discussed above generally with respect to a source model surface, to produce a triangulated surface 90 as shown in FIG. 31 which is a single developable surface, and which has a surface section perimeter which is a polygonal approximation of the original source model surface. In the surface 90, two suspended triangles 92, 94 have been identified.

As shown in FIG. 32, remaining within the realm of the 3D modeling application, the single developable surface 90 of FIG. 31 may be represented as a modified model surface 96 comprised of one or more NURBS patches which are derived from the optimal triangulation of the perimeter polygon 89. If the triangulated surface includes any suspended triangles, then it may be represented by multiple NURBS patches, with each suspended triangle defining its own NURBS patch. Each NURBS patch is a developable surface, and each suspended triangle has corresponding NURBS patch. The surface 96 thus has a first NURBS patch 98 which adjoins a second NURBS patch 100 corresponding to the suspended triangle 94, a third NURBS patch 102 adjacent the second patch 100, a fourth NURBS patch 104 which extends between the suspended triangle second NURBS patch 100 and a fifth NURBS patch 106 which corresponds to the suspended triangle 92. A sixth NURBS patch 108, and a seventh NURBS patch 10 extend from either side of the fifth NURBS patch 106. The surfaces of the NURBS patches of the surface 96 are trimmed according to the original curvilinear perimeter 91 of the source model surface 88, such that the surface 96 has a perimeter 112 which is the same as the perimeter 91. The result is a modified model surface which is comprised entirely of developable surfaces, but which retains the original perimeter of the source model surface. The modified model surface, which is not yet output as a physical object, may then be further processed or manipulated within a 3D modeling application.

It should be noted that, although the triangulation method has been discussed as involving dividing the perimeter polygon with a trial triangle to produce a left remainder polygon and a right remainder polygon, any approach which divides the perimeter polygon into two or three sections, and which then evaluates the costs of those divided sections would be effective. For example, instead of dividing the perimeter polygon with a triangle, it might be divided into two sections with a line extending between two vertices, then calculate the costs associated with each of the polygons so formed and add the bend cost between the two polygons as cost element to that triangulation.

Furthermore, although each possibility can be assessed in performing the triangulation, it would also be possible to evaluate less than all possibilities, in the interest of reducing computational effort. For example, an edge could be randomly picked, and then rather than examining all triangulations involving that edge, a random sample of possible triangulations could be sampled.

It is understood that the invention is not limited to the particular construction and arrangement of parts herein illustrated and described, but embraces all such modified forms thereof as come within the scope of the following claims.

I claim:

1. A method for producing an output surface composed of developable surface elements corresponding to a three-dimensional source model surface, comprising the steps of:
   identifying boundaries on the source model surface which divide the source model surface into at least one surface section such that each surface section is bounded by a single closed curve which defines a surface section perimeter;
   representing each surface section perimeter by a plurality of vertices positioned along the surface section perimeter to define a perimeter polygon;
   for each of the at least one surface section, examining a plurality of possible divisions of the surface section into triangles which connect the vertices of the perimeter polygon, and assigning costs to each of the plurality of possible divisions based on a function which relates individual triangles to each other, or to some characteristic of the source surface, or both, and comparing the costs of each of said plurality of possible divisions to determine the optimal triangulation of each perimeter polygon, each triangulation corresponding to a developable surface which has the perimeter polygon as a perimeter;
   using each optimal triangulation to define a perimeter of a flattened output surface element; and
   outputting instructions for fabricating from a sheet material each output surface element to have the defined perimeter of the output surface element.

2. The process of claim 1 wherein the step of identifying boundaries on the source model surface further comprises the step of identifying surface sections that have a plurality of closed curves, and connecting the closed curves to form a single closed curve.

3. The process of claim 1 wherein the step of identifying boundaries on the source model surface further comprises the step of identifying those surface sections which have surfaces which are doubly curved, and dividing said surface sections by at least one line which extends inwardly from the perimeter and returns to the perimeter and extends along the original surface section.

4. The process of claim 1 further comprising the steps of:
   cutting the plurality of segments from sheet material; and
   assembling the plurality of segments to form an output object.

5. The process of claim 1 wherein the step of outputting instructions comprises printing lines on the definite material.

6. The process of claim 1 wherein the step of examining a plurality of possible divisions of the surface section into triangles comprises examining substantially all possible divisions.

7. The process of claim 1 wherein the step of assigning costs to each of the plurality of possible divisions includes the step of determining a bend cost between adjacent triangles by carrying out the steps of:
   determining the surface normal of each triangle within a possible division; and
   comparing the differences in the surface normals between each pair of adjacent triangles, and assigning costs to a possible division according to the degree of difference between surface normals.

8. The process of claim 7 wherein the bend cost between two adjacent triangles is determined such that the surface normal of a first triangle is $\vec{N}_1$, and the surface normal of second triangle which is adjacent to the first triangle along an edge e is $\vec{N}_2$, and the bend cost BendCost is determined according to the following relationship, where f is a function of length(e) and BendDelta:

$$\text{BendDelta} = |\vec{N}_2 - \vec{N}_1|$$

$$\text{BendCost} = f(\text{length}(e), \text{BendDelta}).$$

9. The process of claim 1 wherein the step of assigning costs to each of the plurality of possible divisions includes the step of determining an edge cost for the edges of each triangle within a triangulation which lie on the perimeter polygon by carrying out the steps of:

determining surface normals of the source model surface section at each vertex along the perimeter polygon;

dividing the sum of the edge normals at vertices on each end of an edge under consideration, by the sum of the edge normal magnitudes to determine an average edge normal; and     assigning a cost by multiplying the length of the edge under consideration times the average difference between the average edge normal and the surface normal of the triangle.

10. The method of claim 1 wherein the step of outputting instructions includes outputting instructions to form surface element identifying numbers which project from each surface element.

11. A method for producing an output surface composed of at least one developable surface element corresponding to a three-dimensional source model surface, comprising the steps of:

identifying boundaries on the source model surface which divide the source model surface into at least one surface section such that each surface section is bounded by a single closed curve which defines a surface section perimeter;

representing each surface section perimeter by a plurality of vertices positioned along the surface section perimeter to define a perimeter polygon;

examining a plurality of alternative divisions of at least one surface section into triangles which connect the vertices of the perimeter polygon, and assigning costs to each of the plurality of alternative divisions such that a better approximation to the source model surface section has a lower cost, and selecting a lowest cost division of the surface section into a plurality of triangles in which at least one suspended triangle extends between vertices on the perimeter polygon such that said suspended triangle has only chords extending between vertices but no edges lying on the perimeter polygon;

flattening each output perimeter polygon optimal triangulation to define a planar output surface element perimeter; and     outputting instructions for a cutting tool for fabricating from a planar material each output surface element by cutting along its output surface element perimeter.

12. The process of claim 11 wherein the step of identifying boundaries on the source model surface further comprises the step of identifying surface sections that have a plurality of closed curves, and connecting the closed curves to form a single closed curve.

13. The process of claim 11 wherein the step of identifying boundaries on the source model surface further comprises the step of identifying those surface sections which have surfaces which are doubly curved, and dividing said surface sections by at least one line which extends inwardly from the perimeter and returns to the perimeter and extends along the original surface section, wherein the at least one dividing line begins at a first point and terminates at a second point which is either identical to the first point or spaced from the first point along the perimeter.

14. The process of claim 11 further comprising the steps of:

cutting the plurality of segments from planar material; and     assembling the plurality of segments to form an output object.

15. A process for forming an output object assembled from sheet elements, the output object having a surface which approximates the surface of a source model, comprising the steps of:

dividing the source model surface into a plurality of surface sections;

identifying the perimeter of each surface section;

approximating each surface section perimeter with a perimeter polygon comprised of a plurality of vertices which lie on said surface section perimeter and which are connected by line segments;

determining a low cost triangulation of each perimeter polygon by comparing a first triangulation to at least one second different triangulation, wherein a cost is determined for each triangulation by applying a function which compares an attribute of each triangle of a possible triangulation with a like attribute of an adjacent triangle of said possible triangulation, or with an attribute of one or more vertices of said triangle on the source model surface section;

flattening the determined low cost triangulations of all the perimeter polygons;

outputting the flattened triangulations as sheet elements; and     assembling the output sheet elements to form the output object.

16. The process of claim 15 wherein in the step of determining a cost for each triangulation as a function of comparing an attribute of each triangle, the attribute is selected from the group consisting of triangle surface normal, triangle surface area, and combined triangle edge length.

17. The process of claim 15 wherein the cost is determined for each triangulation as a function of one or more of the following attributes:

the maximum or minimum angle defined within a triangle;

the combined length of the edges of a triangle;

the surface area of a triangle;

the difference in surface normal between the triangle and an adjacent triangle;

the difference in surface normal between the triangle and some function of the surface normals of the vertices on the source model surface section; and     the difference in position between the surface of the triangle and the source model surface section defined between the vertices of the triangle.

18. A method for producing an output surface composed of developable surface elements corresponding to an arbitrary three-dimensional source model surface, comprising the steps of:

identifying boundaries on the source model surface which divide the source model surface into surface sections such that each surface section is bounded by a single closed curve which defines a surface section perimeter;

for each surface section perimeter, selecting a plurality of vertices spaced along the surface section perimeter, the plurality of vertices defining a perimeter polygon, and each vertex lying on the source model surface section;

searching for an optimal triangulation comprised of a set of triangles which do not overlap, and which are connected along triangular sides, wherein each triangle has three vertices which are vertices of the perimeter polygon, the triangulation defining a surface which fills the perimeter polygon, wherein the step of searching for an optimal triangulation comprises: performing an analysis of at least two different triangulations by using a first function applied to each triangle of the analyzed triangulation to determine a value of the first function for said analyzed triangulation, the optimal triangulation being that one of the at least two different triangulations which has the lowest value, wherein the first function is a function which relates an attribute of each triangle of an analyzed triangulation to an attribute of the source model surface, or to an attribute of an adjacent triangle;

flattening each optimal triangulation by bringing each triangle of the set of triangles into the same plane by rotation about edges shared by triangles to define a planar output surface element perimeter; and outputting instructions for a cutting tool for fabricating from a planar material each output surface element by cutting along its output surface element perimeter.

19. The method of claim 18 wherein the first function is a function which relates an attribute of each triangle of an analyzed triangulation to an attribute of the source model surface section, and the searching for an optimal triangulation further comprises applying a second function which relates an attribute of each triangle of an analyzed triangulation to an attribute of an adjacent triangle.

20. The method of claim 18 wherein the first function comprises determining a bend value between adjacent triangles by determining the surface normal of each triangle and comparing the differences in the surface normals between each pair of adjacent triangles.

21. The process of claim 18 wherein the first function comprises determining an edge cost for the edges of each triangle within a triangulation which lie on the perimeter polygon by carrying out the steps of:

determining surface normals of the source model surface section at each vertex along the perimeter polygon;

dividing the sum of the edge normals at vertices on each end of an edge under consideration, by the sum of the edge normal magnitudes to determine an average edge normal; and assigning a cost by multiplying the length of the edge under consideration times the average difference between the average edge normal and the surface normal of the triangle.

22. The method of claim 18 wherein the step of searching for an optimal triangulation further comprises evaluating all the possible triangulations and selecting the triangulation in which the first function is at a minimum.

23. The method of claim 18 wherein the first function is a function of one or more of the following attributes:

the maximum or minimum angle defined within a triangle;

the combined length of the edges of a triangle;

the surface area of a triangle;

the difference in surface normal between the triangle and an adjacent triangle;

the difference in surface normal between the triangle and some function of the surface normals of the vertices on the source model surface section; and the difference in position between the surface of the triangle and the source model surface section defined between the vertices of the triangle.

24. A method for creating a set of at least one developable surface patch corresponding to a three-dimensional source model surface, comprising the steps of:

identifying boundaries on the source model surface to identify a surface section bounded by a single closed curve which defines a surface section perimeter;

representing the surface section perimeter by a plurality of vertices positioned along the surface section perimeter to define a perimeter polygon;

examining a plurality of possible divisions of the surface section into triangles which connect the vertices of the perimeter polygon, and assigning costs to each of the plurality of possible divisions based on a function which relates individual triangles to each other, or to some characteristic of the source surface or both, and comparing the costs of each of said plurality of possible divisions, this comparison serving to determine an optimal triangulation of the perimeter polygon, the optimal triangulation corresponding to a developable surface which has the perimeter polygon as a perimeter; and deriving the set of at least one developable surface patch corresponding to the optimal triangulation.

25. The method of claim 24 wherein the determined optimal triangulation has at least one suspended triangle which extends between vertices on the perimeter polygon such that said suspended triangle has only chords extending between vertices but no edges lying on the perimeter polygon.

26. The method of claim 25 wherein the step of deriving the at least one developable surface patch comprises defining a separate developable surface patch corresponding to each suspended triangle found in the optimal triangulation.

27. The method of claim 24 wherein the step of denying the at least one developable surface patch comprises defining at least one NURBS patch.

* * * * *